(12) United States Patent
Johnson et al.

(10) Patent No.: US 7,593,698 B1
(45) Date of Patent: Sep. 22, 2009

(54) LARGE SIGNAL POLAR MODULATED POWER AMPLIFIER

(75) Inventors: Jackie Johnson, Trinity, NC (US); Ryan Bosley, Greensboro, NC (US); Michael F. Zybura, Scotts Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 458 days.

(21) Appl. No.: 11/456,635

(22) Filed: Jul. 11, 2006

(51) Int. Cl.
H04B 1/66 (2006.01)
(52) U.S. Cl. .................. 455/102; 455/108; 375/300; 375/302
(58) Field of Classification Search ............... 455/424, 455/425, 456.5, 456.6, 561, 550.1, 575.1, 455/23, 42, 63.1, 522, 93, 108, 100, 102, 455/114.3, 126, 110; 330/10, 149, 298, 141, 330/204, 281, 296, 307, 285, 129, 248; 332/151, 332/159, 160, 144, 149, 117; 375/300, 295, 375/297, 298, 302, 308, 320, 322, 331
See application file for complete search history.

(56) References Cited

U.S. PATENT DOCUMENTS

| | | | | |
|---|---|---|---|---|
| 5,028,890 A * | 7/1991 | Larson | ....................... | 332/160 |
| 5,329,244 A * | 7/1994 | Fujita et al. | .................. | 330/149 |
| 5,423,074 A * | 6/1995 | Dent | ........................... | 455/74 |
| 6,225,754 B1 * | 5/2001 | Horiuchi et al. | ............. | 315/246 |
| 6,278,328 B1 * | 8/2001 | Yamamoto et al. | .......... | 330/298 |
| 6,295,442 B1 * | 9/2001 | Camp et al. | .................. | 455/102 |
| 6,366,177 B1 | 4/2002 | McCune et al. | | |
| 6,377,784 B2 | 4/2002 | McCune | | |
| 6,438,360 B1 * | 8/2002 | Alberth et al. | .............. | 455/110 |
| 6,801,086 B1 | 10/2004 | Chandrasekaran | | |
| 6,924,711 B2 * | 8/2005 | Liu | ............................ | 332/159 |
| 6,978,417 B1 * | 12/2005 | Kohn et al. | .................. | 715/202 |
| 7,010,276 B2 * | 3/2006 | Sander et al. | ................ | 455/108 |
| 7,023,292 B2 * | 4/2006 | Pehlke et al. | ................. | 332/151 |
| 7,038,536 B2 * | 5/2006 | Cioffi et al. | .................... | 330/10 |
| 7,158,494 B2 * | 1/2007 | Sander et al. | ................ | 370/329 |
| 7,227,342 B2 * | 6/2007 | McCune, Jr. | ................. | 323/225 |
| 7,359,685 B2 * | 4/2008 | Jafari et al. | .................. | 455/126 |
| 7,424,064 B2 * | 9/2008 | Shakeshaft et al. | .......... | 375/295 |
| 2002/0141510 A1 * | 10/2002 | Sridharan et al. | ........... | 375/300 |
| 2003/0157905 A1 * | 8/2003 | Holmqvist | ................... | 455/102 |
| 2004/0240583 A1 * | 12/2004 | Rauh et al. | .................... | 375/297 |
| 2005/0008373 A1 * | 1/2005 | Fujiwara et al. | ............. | 398/186 |
| 2007/0014382 A1 * | 1/2007 | Shakeshaft et al. | .......... | 375/297 |
| 2007/0142000 A1 * | 6/2007 | Herzinger | .................... | 455/91 |
| 2007/0298734 A1 * | 12/2007 | Woo et al. | ................. | 455/114.3 |

* cited by examiner

*Primary Examiner*—Duc Nguyen
*Assistant Examiner*—Charles Chow
(74) *Attorney, Agent, or Firm*—Withrow & Terranova, P.L.L.C.

(57) ABSTRACT

Polar modulation input signals to a polar modulated power amplifier include a phase modulated (PM) input signal, which feeds a power amplifier input, and an amplitude modulated (AM) input signal, which provides an envelope supply voltage for the power amplifier. The present invention is a large signal polar modulated power amplifier that extends the effective amplitude range of AM input signals that can be handled by the power amplifier by amplitude modulating the PM input signal using the AM input signal. Amplitude modulating the PM input signal effectively lowers the amplitude of the PM input signal when the amplitude of the AM input signal is lowered, which maintains adequate headroom between the power amplifier's signal input and envelope supply voltage input in the presence of large amplitude AM input signals. As a result, the power amplifier can amplify larger amplitude AM input signals than traditional power amplifier designs.

18 Claims, 5 Drawing Sheets

LARGE SIGNAL POLAR MODULATED POWER AMPLIFIER

FIELD OF THE INVENTION

The present invention relates to Radio Frequency (RF) power amplifiers used in RF communications circuitry.

BACKGROUND OF THE INVENTION

With the growth of the wireless communications industry, wireless communications protocols become more sophisticated and demanding in their requirements for complex modulation schemes and narrow channel bandwidths. The ultimate goal is to encode as much digital information as possible in a given channel. One such modulation scheme for encoding digital information is polar modulation. Polar modulated RF transmitters utilize both amplitude modulation and phase modulation to maximize the amount of information that can be encoded with minimum bandwidth. By using multiple combinations of phase and amplitude, multiple digital bits of information can be represented. Large signal amplitude modulation allows several distinct levels of modulation with adequate noise margins for reliable encoding of digital data. However, in a polar modulated system, large signal amplitude modulation can interfere with proper operation of phase modulated (PM) signals. The bandwidth of transmitted polar modulated RF signals must be contained within a single channel. Output Radio Frequency Spectrum (ORFS) is a measure of adjacent channel interference, which must be minimized. Some polar modulated RF transmitters may use pre-distortion methods with polynomial curve fitting to meet RF spectrum requirements.

In a typical polar modulated RF transmitter, PM signals follow a conventional signal path. An RF modulator receives a phase modulation signal and phase modulates an RF carrier to produce a PM RF signal, which may then be amplified by one or more RF driver amplifier stages that feed an RF final amplifier stage as part of an RF power amplifier. The RF final amplifier stage amplitude modulates the PM RF signal to create a polar modulated RF output signal. The RF final amplifier stage receives an envelope supply voltage from an amplitude modulated (AM) power supply, which provides the amplitude modulation in the final stage. In some designs, an RF final amplifier stage may use one or more bipolar NPN transistor as an active element, in which the collector of the NPN transistor is coupled to the envelope supply voltage. The PM RF signal is fed to the base of the NPN transistor. In the presence of large signal amplitude modulation signals, the voltage at the collector of the NPN transistor may drop below the voltage at the base of the NPN transistor, resulting in forward biasing of the base-to-collector junction, which distorts the amplified PM RF signal and degrades the RF spectrum. Therefore, to meet ORFS requirements and minimize pre-distortion requirements, there is a need for a polar modulated power amplifier that does not forward bias its base-to-collector junction in the presence of large AM signals.

SUMMARY OF THE INVENTION

Polar modulation input signals to a polar modulated power amplifier include a phase modulated (PM) input signal, which feeds a power amplifier input, and an amplitude modulated (AM) input signal, which provides an envelope supply voltage for the power amplifier. The present invention is a large signal polar modulated power amplifier that extends the effective amplitude range of AM input signals that can be handled by the power amplifier by amplitude modulating the PM input signal using the AM input signal. Amplitude modulating the PM input signal effectively lowers the amplitude of the PM input signal when the amplitude of the AM input signal is lowered, which maintains adequate headroom between the power amplifier's signal input and envelope supply voltage input in the presence of large amplitude AM input signals. As a result, the power amplifier can amplify larger amplitude AM input signals than traditional power amplifier designs.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Polar modulation input signals to a polar modulated power amplifier include a PM input signal, which feeds a power amplifier input, and an AM input signal, which provides an envelope supply voltage for the power amplifier. The present invention is a large signal polar modulated power amplifier that extends the effective amplitude range of AM input signals that can be handled by the power amplifier by amplitude modulating the PM input signal using the AM input signal. Amplitude modulating the PM input signal effectively lowers the amplitude of the PM input signal when the amplitude of the AM input signal is lowered, which maintains adequate headroom between the power amplifier's signal input and envelope supply voltage input in the presence of large amplitude AM input signals. As a result, the power amplifier can amplify larger amplitude AM input signals than traditional power amplifier designs.

Figure 1:
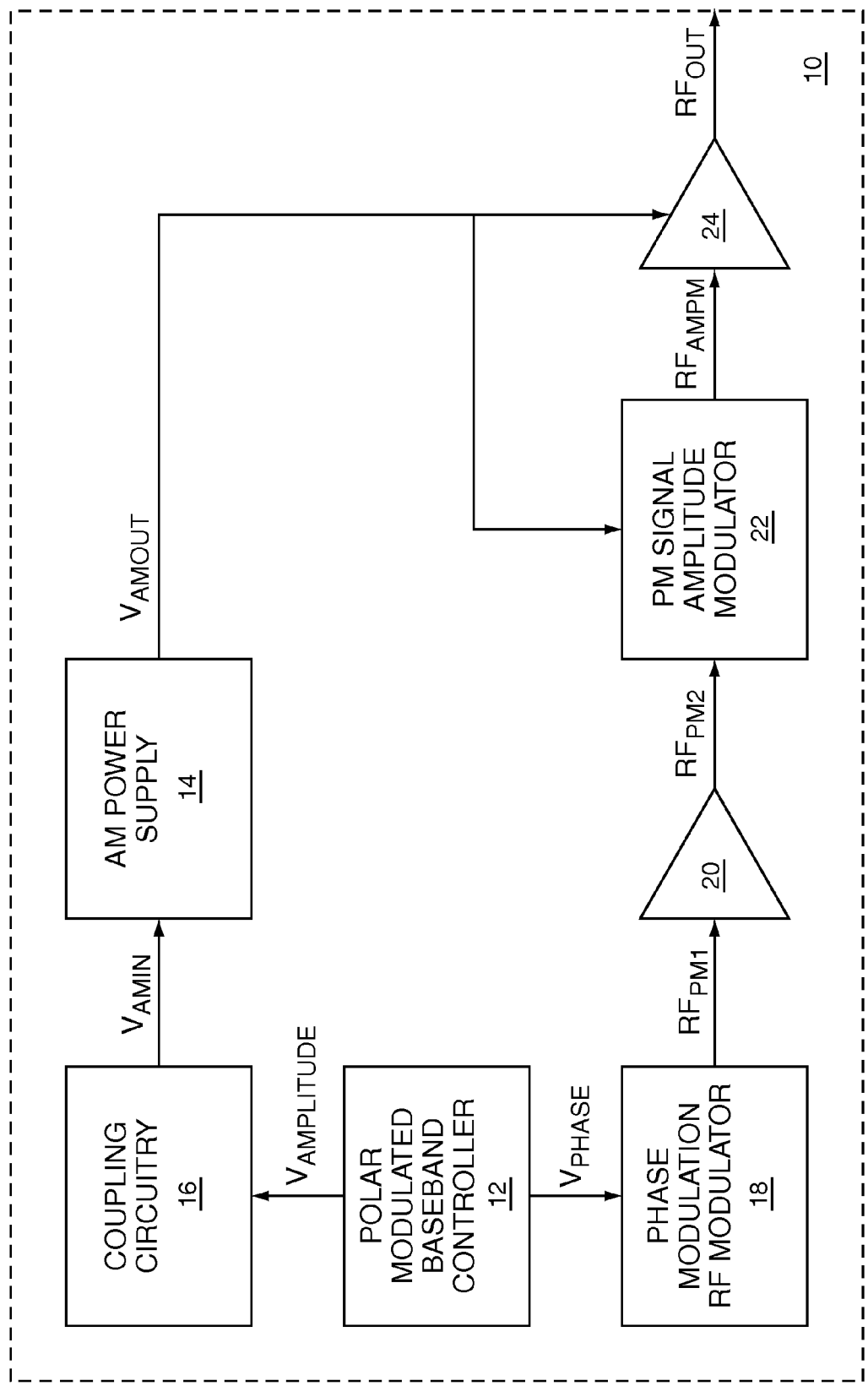
FIG. 1 shows a first embodiment of the present invention used in a polar modulated RF transmitter, wherein the AM signal used to amplitude modulate the PM input signal is taken from the output of the AM power supply, which provides the envelope supply voltage for the power amplifier.

FIG. 1 shows a first embodiment of the present invention used in a polar modulated transmitter 10. A polar modulated baseband controller 12 provides an amplitude modulation signal $V_{AMPLITUDE}$ and a phase modulation signal $V_{PHASE}$. $V_{AMPLITUDE}$ is provided to an AM power supply 14 through coupling circuitry 16, which adapts $V_{AMPLITUDE}$ into an AM power supply input signal $V_{AMIN}$. The AM power supply uses $V_{AMIN}$ to create an AM power supply output signal $V_{AMOUT}$, which provides an envelope supply voltage. $V_{PHASE}$ feeds a phase modulation RF modulator 18, which uses $V_{PHASE}$ to phase modulate an RF carrier (not shown) to create a first PM signal $RF_{PM1}$. An RF power amplifier driver circuit 20 amplifies $RF_{PM1}$ to create a second PM signal $RF_{PM2}$. The RF power amplifier driver circuit 20 may include one or more amplifier stages. A PM signal amplitude modulator circuit 22 receives and amplitude modulates $RF_{PM2}$ using $V_{AMOUT}$ to create an amplitude modulated phase modulation signal $RF_{AMPM}$, which provides the RF input signal to an RF power amplifier final stage 24. The RF power amplifier final stage 24 uses $V_{AMOUT}$ as its envelope supply voltage, which provides amplitude modulation of the RF input signal to create a polar modulated RF output signal $RF_{OUT}$. Since the RF input signal to the RF power amplifier final stage 24 is the amplitude modulated phase modulation signal $RF_{AMPM}$, which was previously amplitude modulated, headroom in the RF power amplifier final stage 24 between the RF input signal and the envelope supply voltage is maintained, which allows use of large amplitude AM input signals.

Figure 2:
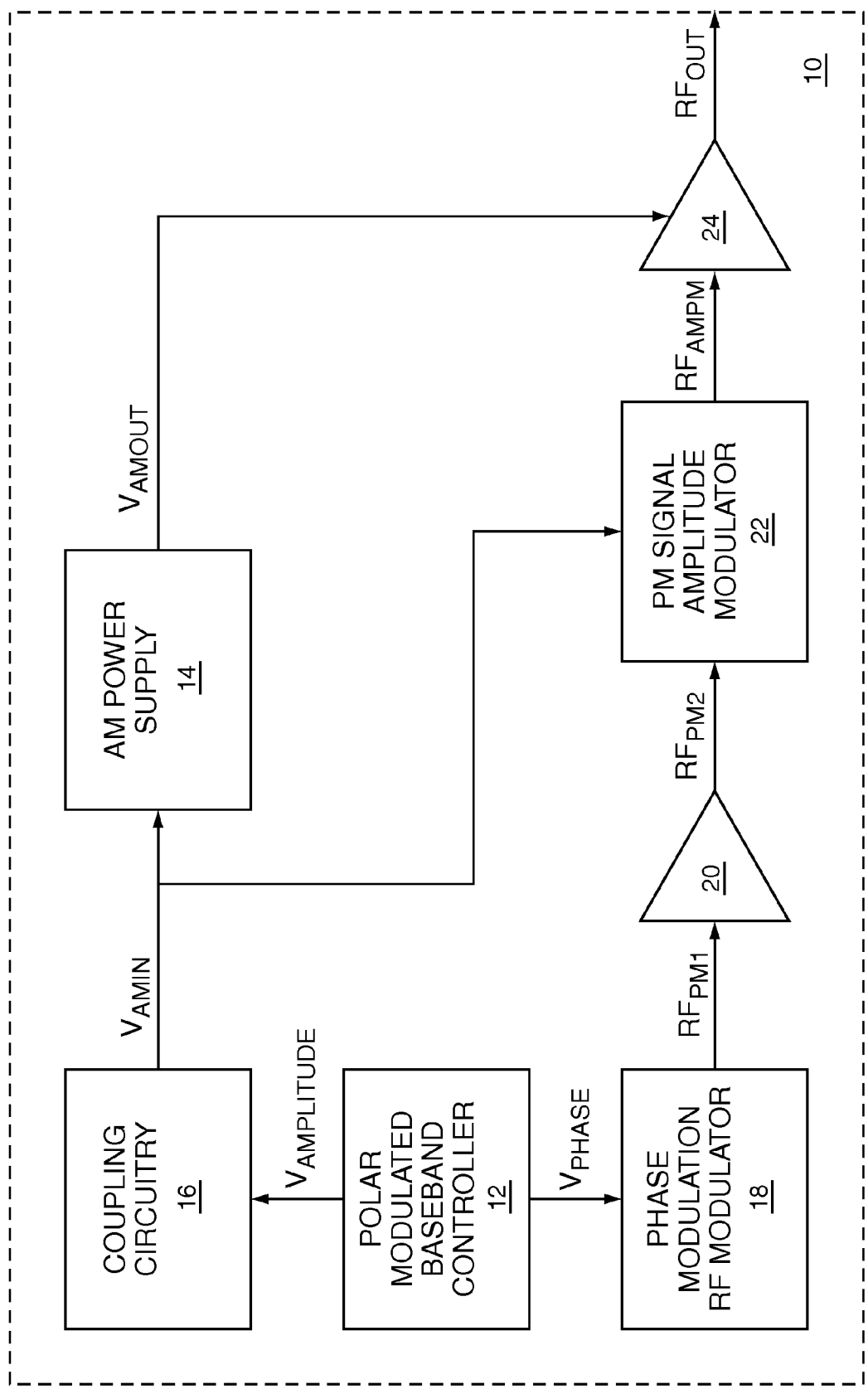
FIG. 2 shows a second embodiment of the present invention used in a polar modulated RF transmitter, wherein the AM signal used to amplitude modulate the PM input signal is taken from the input of the AM power supply, which provides the envelope supply voltage for the power amplifier.

FIG. 2 shows a second embodiment of the present invention, which is similar to the first embodiment of the present invention shown in FIG. 1, except the PM signal amplitude modulator circuit 22 uses $V_{AMIN}$ instead of $V_{AMOUT}$ to create the amplitude modulated phase modulation signal $RF_{AMPM}$.

Figure 3:
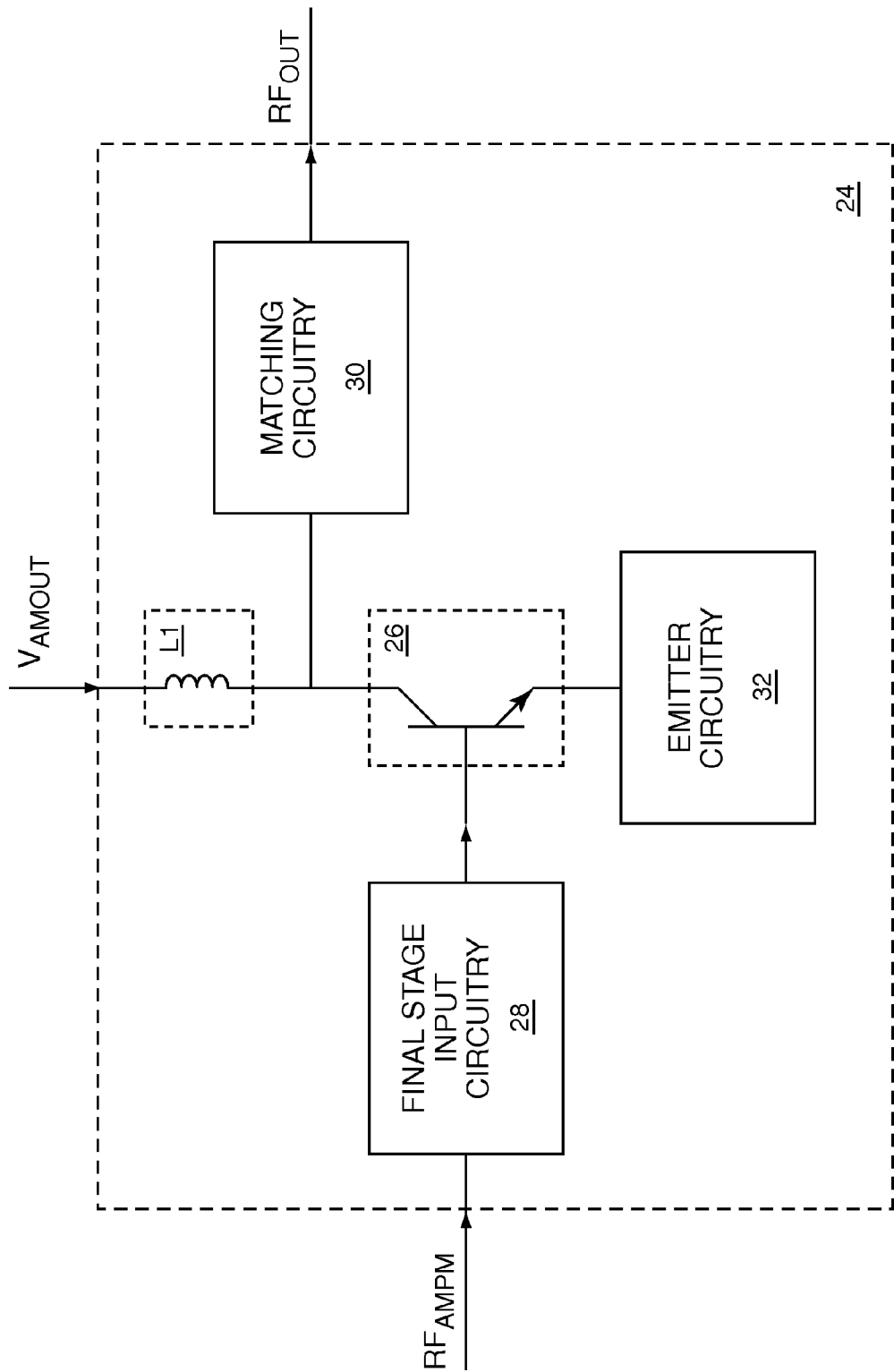
FIG. 3 shows details of the final stage of the power amplifier of FIG. 1.

FIG. 3 shows details of the RF power amplifier final stage 24 of FIG. 1. An NPN transistor 26 is the primary active element in the final stage 24, and is fed the amplitude modulated phase modulation signal $RF_{AMPM}$ through final stage input circuitry 28. $V_{AMOUT}$ provides the envelope supply voltage to the collector of the NPN transistor 26 through an inductor L1. Since the envelope supply voltage is amplitude modulated, the NPN transistor 26 amplifies and amplitude modulates $RF_{AMPM}$. The polar modulated RF output signal $RF_{OUT}$ is provided from the collector of the NPN transistor 26 through matching circuitry 30. The emitter of the NPN transistor 26 is connected to emitter circuitry 32. The PM signal amplitude modulator circuit 22 provides sufficient amplitude modulation in creating $RF_{AMPM}$ to prevent the base-to-collector junction of the NPN transistor 26 from becoming forward biased, even in the presence of large AM input signals. By preventing forward biasing of the base-to-collector junction of the NPN transistor 26, proper amplification behavior is maintained. In one embodiment of the present invention, the NPN transistor 26 may include an array of at least one bipolar NPN transistor.

Figure 4:
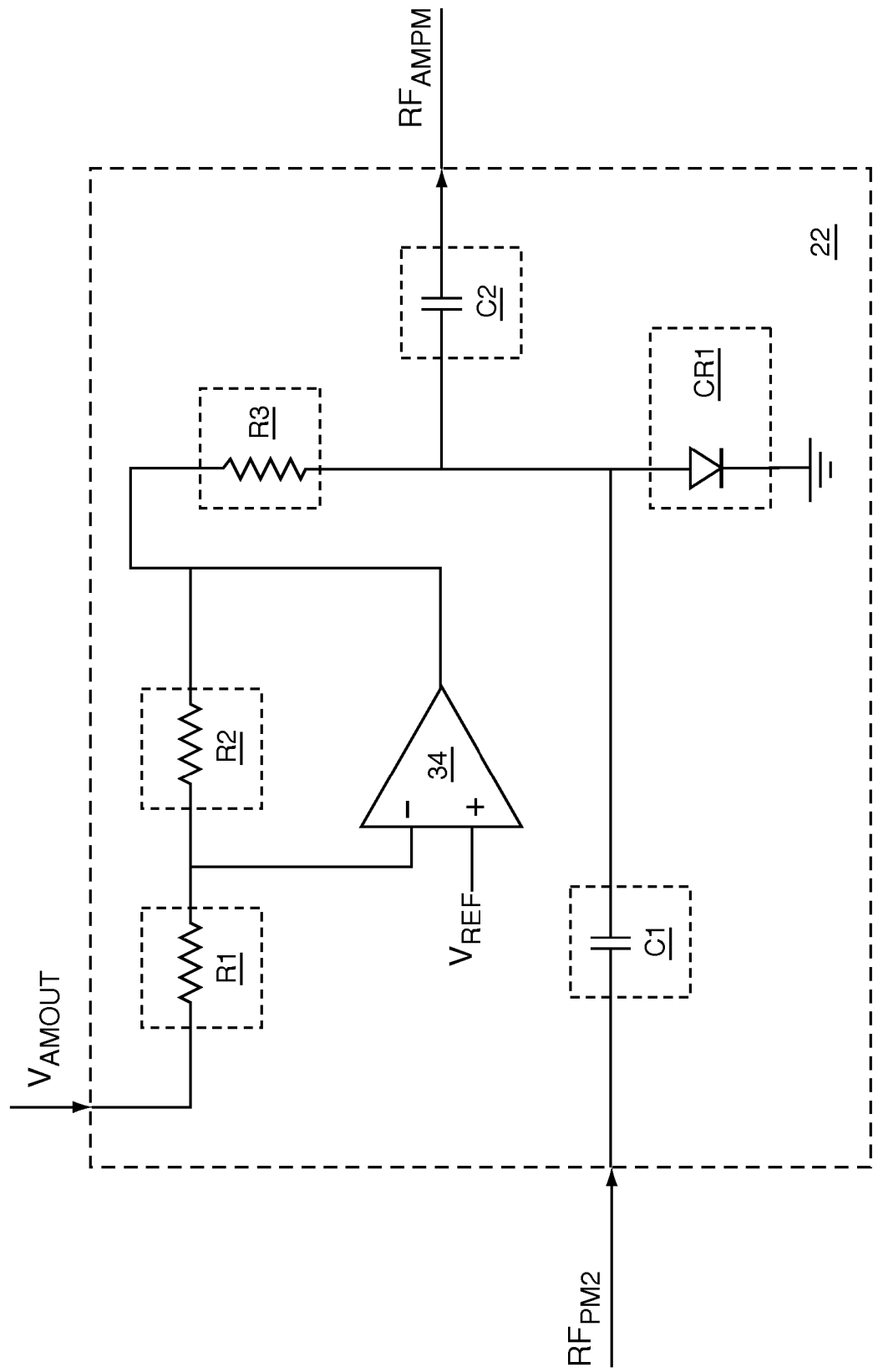
FIG. 4 shows details of the PM signal amplitude modulator of FIG. 1.

FIG. 4 shows details of the PM signal amplitude modulator circuit 22 of FIG. 1. An operational amplifier 34 amplifies and inverts the AM power supply output signal $V_{AMOUT}$. The gain of the operational amplifier 34 is determined by two gain resistors R1, R2. The DC bias point of the operational amplifier 34 is set by a DC reference voltage VREF. The amplified and inverted AM power supply output signal feeds a current setting resistor R3 coupled to the anode of a diode CR1. The cathode of the diode CR1 is coupled to ground. The amplitude modulated phase modulation signal $RF_{AMPM}$ is created by feeding the second PM signal $RF_{PM2}$ through two coupling capacitors C1, C2, which are coupled to the anode of the diode CR1. The current setting resistor R3 provides current to the diode CR1 inversely to the amplitude of the AM power supply output signal $V_{AMOUT}$. As the current to the diode CR1 increases, the RF impedance of the diode CR1 decreases; therefore, as the amplitude of the AM power supply output signal $V_{AMOUT}$ decreases, the voltage across the current setting resistor R3 increases, the current through the diode CR1 increases, and the RF impedance of the diode CR1 decreases, which reduces the amplitude of the amplitude modulated phase modulation signal $RF_{AMPM}$.

Figure 5:
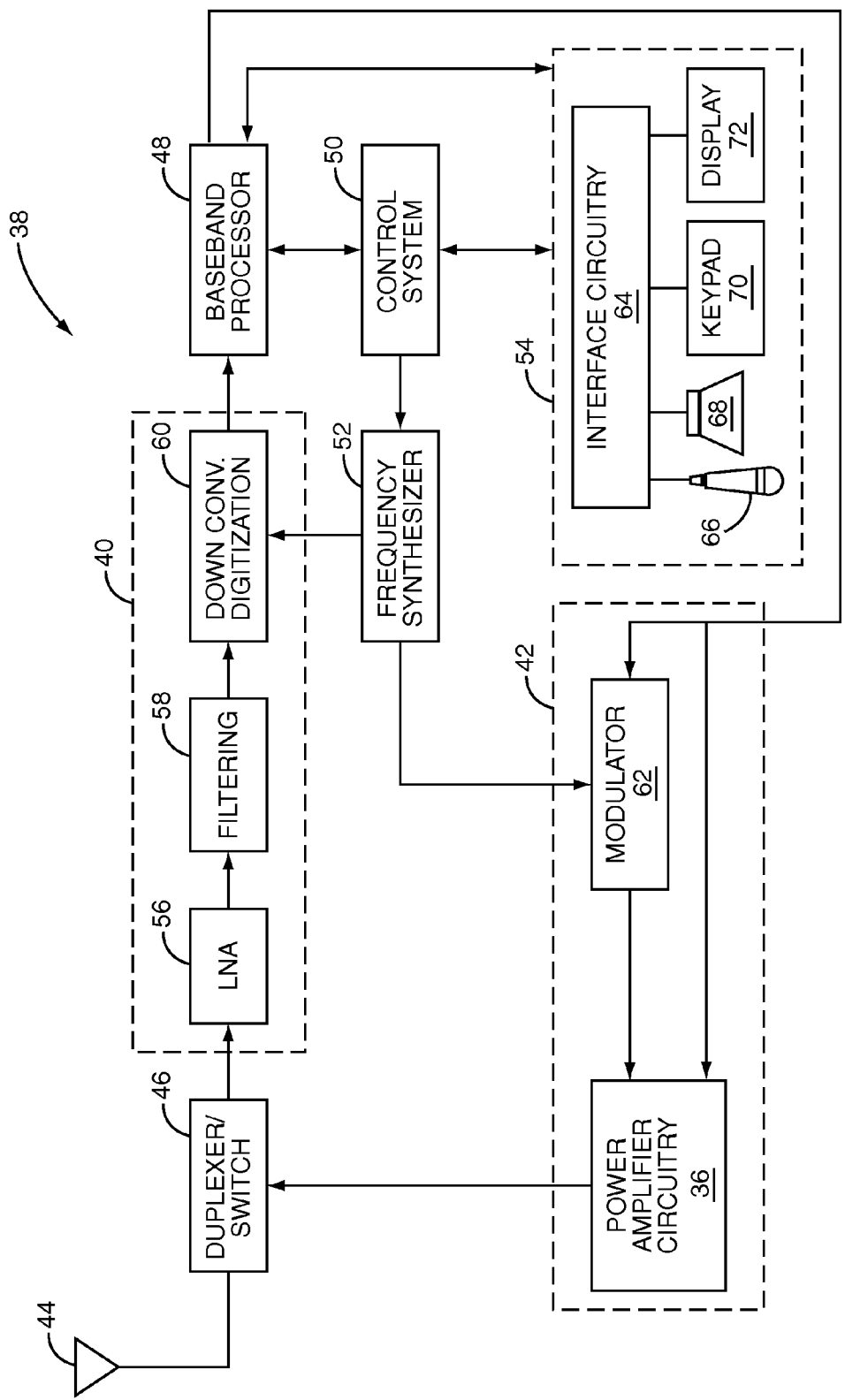
FIG. 5 shows an application example of the present invention used in a mobile terminal.

FIG. 5 shows an application example of a large signal polar modulated RF power amplifier used in power amplifier circuitry 36 in a mobile terminal 38. The basic architecture of the mobile terminal 38 may include a receiver front end 40, a radio frequency transmitter section 42, an antenna 44, a duplexer or switch 46, a baseband processor 48, a control system 50, a frequency synthesizer 52, and an interface 54. The receiver front end 40 receives information bearing radio frequency signals from one or more remote transmitters provided by a base station. A low noise amplifier (LNA) 56 amplifies the signal. A filter circuit 58 minimizes broadband interference in the received signal, while downconversion and digitization circuitry 60 downconverts the filtered, received signal to an intermediate or baseband frequency signal, which is then digitized into one or more digital streams. The receiver front end 40 typically uses one or more mixing frequencies generated by the frequency synthesizer 52. The baseband processor 48 processes the digitized received signal to extract the information or data bits conveyed in the received signal. This processing typically comprises demodulation, decoding, and error correction operations. As such, the baseband processor 48 is generally implemented in one or more digital signal processors (DSPs).

On the transmit side, the baseband processor 48 receives digitized data, which may represent voice, data, or control information, from the control system 50, which it encodes for transmission. The encoded data is output to the transmitter 42, and contains phase modulation and amplitude modulation information needed for polar modulation. The phase modulation information is used by a modulator 62 to modulate a carrier signal that is at a desired transmit frequency. The power amplifier circuitry 36 amplifies and amplitude modulates the modulated carrier signal to create a polar modulated RF signal appropriate for transmission, and delivers the amplified and modulated carrier signal to the antenna 44 through the duplexer or switch 46.

A user may interact with the mobile terminal 38 via the interface 54, which may include interface circuitry 64 associated with a microphone 66, a speaker 68, a keypad 70, and a display 72. The interface circuitry 64 typically includes analog-to-digital converters, digital-to-analog converters, amplifiers, and the like. Additionally, it may include a voice encoder/decoder, in which case it may communicate directly with the baseband processor 48. The microphone 66 will typically convert audio input, such as the user's voice, into an electrical signal, which is then digitized and passed directly or indirectly to the baseband processor 48. Audio information encoded in the received signal is recovered by the baseband processor 48, and converted by the interface circuitry 64 into an analog signal suitable for driving the speaker 68. The keypad 70 and display 72 enable the user to interact with the mobile terminal 38, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A polar modulated power amplifier circuit comprising:
   an amplitude modulation circuit adapted to:
   receive a phase modulated (PM) input signal;
   receive a first amplitude modulated (AM) input signal;
   provide a PM final stage signal, wherein an amplitude of the PM final stage signal is based on the first AM input signal, and a phase of the PM final stage signal is based on the PM input signal; and
   control the amplitude of the PM final stage signal to prevent a base-to-collector junction of a base and a collector from becoming forward biased; and
   a final amplifier stage:
   comprising:
   the base adapted to receive the PM final stage signal; and
   the collector adapted to receive a second AM input signal; and
   adapted to provide a polar modulated output signal, wherein an amplitude of the polar modulated output signal is based on the second AM input signal, and a phase of the polar modulated output signal is based on the PM final stage signal.

2. The power amplifier circuit of claim 1 wherein the amplitude of the PM final stage signal is based on an amplitude of the first AM input signal.

3. The power amplifier circuit of claim 2 wherein the amplitude of the PM final stage signal decreases as the amplitude of the first AM input signal decreases.

4. The power amplifier circuit of claim 1 wherein the phase of the PM final stage signal is based on a phase of the PM input signal.

5. The power amplifier circuit of claim 1 wherein the amplitude of the polar modulated output signal is based on an amplitude of the second AM input signal.

6. The power amplifier circuit of claim 1 wherein the phase of the polar modulated output signal is based on the phase of the PM final stage signal.

7. The power amplifier circuit of claim 1 wherein the first AM input signal is substantially identical to the second AM input signal.

8. The power amplifier circuit of claim 1 wherein the second AM input signal is substantially proportional to the first AM input signal.

9. The power amplifier circuit of claim 1 wherein the second AM input signal is substantially proportional to the first AM input signal plus an offset.

10. The power amplifier circuit of claim 1 wherein the final amplifier stage further comprises an array of one or more bipolar NPN transistors having the base and the collector.

11. The power amplifier circuit of claim 1 wherein the amplitude modulation circuit further comprises:
    a PM input adapted to receive the PM input signal;
    a PM output adapted to provide the PM final stage signal; and
    a variable impedance element,
    wherein the PM input is coupled to the PM output, and the variable impedance element is coupled between the PM output and ground.

12. The power amplifier circuit of claim 11 wherein the amplitude of the PM final stage signal is controlled by varying an impedance of the variable impedance element.

13. The power amplifier circuit of claim 12 wherein the amplitude of the PM final stage signal decreases as the impedance of the variable impedance element decreases.

14. The power amplifier circuit of claim 12 wherein the variable impedance element further comprises a diode element.

15. The power amplifier circuit of claim 12 wherein the impedance of the variable impedance element is controlled by varying a control current flowing through the variable impedance element.

16. The power amplifier circuit of claim 12 wherein the impedance of the variable impedance element increases as an amplitude of the first AM input signal increases.

17. The power amplifier circuit of claim 1 wherein the first AM input signal is provided from an amplitude modulated power supply output.

18. The power amplifier circuit of claim 1 wherein the first AM input signal is provided from an amplitude modulated power supply input.

* * * * *